United States Patent

[11] 3,616,380

[72] Inventors Martin P. Lepselter
New Providence;
Joseph R. Ligenza, Califon, both of N.J.
[21] Appl. No. 778,099
[22] Filed Nov. 22, 1968
[45] Patented Oct. 26, 1971
[73] Assignee Bell Telephone Laboratories, Incorporated
Murray Hill, N.J.

[54] BARRIER LAYER DEVICES AND METHODS FOR THEIR MANUFACTURE
3 Claims, 2 Drawing Figs.

[52] U.S. Cl. .......... 204/164, 29/571, 317/235
[51] Int. Cl. .......... B01k 1/00
[50] Field of Search .......... 204/164, 312; 148/1.5; 317/235; 29/571

[56] References Cited

UNITED STATES PATENTS

| | | | |
|---|---|---|---|
| 3,290,127 | 12/1966 | Kahng et al. .......... | 317/235 |
| 3,337,438 | 8/1967 | Gobeli et al. .......... | 204/164 |
| 3,442,701 | 5/1969 | Lepselter .......... | 317/235 |
| 3,492,174 | 1/1970 | Nakamura et al. .......... | 317/235 |

*Primary Examiner*—John H. Mack
*Assistant Examiner*—Neil A. Kaplan
*Attorneys*—R. J. Guenther and Arthur J. Torsiglieri

ABSTRACT: The specification describes an improved barrier layer device which utilizes an oxide guard ring around the barrier layer. An insulating guard ring is shown to be superior to the PN junction guard ring of the prior art. Manufacturing methods for forming oxide guard rings are also discussed. These involve forming the oxide layer by exposure to an oxygen plasma.

Figure 1:
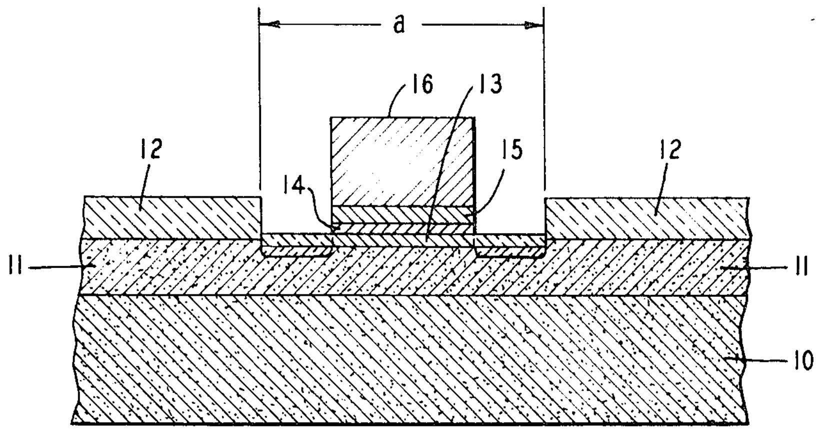

INVENTORS: M. P. LEPSELTER
J. R. LIGENZA
BY
ATTORNEY

BARRIER LAYER DEVICES AND METHODS FOR THEIR MANUFACTURE

This invention relates to improved Schottky barrier layer devices and to methods for their manufacture.

Surface barrier diodes, which are based on nonohmic conduction at a metal-to-semiconductor junction, are well known. However, the "soft" reverse characteristic which seems to be a general defect in these devices resists their usefulness for certain important device applications. The mechanism responsible for this anomalous behavior has recently been identified as a premature reverse breakdown caused by edge effects at the junction. A suggested remedy is to construct the diode so that the junction is essentially planar over its entire area. One method of obtaining this structure is to use a guard ring as described and claimed in U.S. application Ser. No. 676,509, filed Oct. 19, 1967, by M. P. Lepselter and S. M. Sze, and assigned to the assignee of this application, Bell Telephone Laboratories, Incorporated. This is also described in The Bell System Technical Journal, Vol. 47, No. 2 pp. 195–208, (1968). Diodes made according to these teachings have been found to exhibit sharp, near-ideal, reverse breakdown characteristics. It is evident that a Schottky diode made with a guard ring structure is a useful and potentially important device. It is also evident that similar considerations apply to conventional PN junctions since the electric field profile at a Schottky barrier is directly comparable to the field profile at a PN junction and the Schottky barrier, for the purposes of this invention, can be considered as a shallow PN junction. Thus in its broadest aspects this invention is applicable to "-barrier layer devices," a term which is intended to be generic to the various forms of rectifying junctions.

The improved barrier layer device in which the guard ring is an insulating layer formed into the planar surface of the device is structurally distinct from those device configurations proposed previously. By comparison to the prior art PN junction guard ring, the insulating guard ring is advantageous because of its inherent simplicity and because the diode can be made with lower series resistance in the substrate layer. The parallel capacitance of the PN junction is also eliminated. More specifically, it has been found that the reverse breakdown voltage of a Schottky barrier guarded by a PN junction is strongly influenced by the impurity gradient of the junction and that a gradually graded junction enhances the breakdown. However, a graded junction requires a thicker substrate and this contributes a parasitic resistance. The presence of unwanted parallel capacitance attributable to the presence of the junction guard ring is self-evident.

Processing techniques for forming insulating guard ring structures are additional aspects of the invention. While there are undoubtedly many possible approaches to the manufacture of barrier layer devices with insulating guard rings, those described hereinafter are especially compatible with planar and beam lead processing techniques.

For instance, one fabricating sequence, which is oriented toward metal silicide-silicon barrier devices, briefly involves the steps of depositing a surface insulator on a silicon substrate, etching a window in the insulator, depositing a silicide-forming metal film in the window, depositing a metal contact within the window so as to leave an annular space between the contact and the oxide, and oxidizing the silicide exposed in the annulus and the silicon surface below the interface to form the oxide guard ring. It will be appreciated that the guard ring is precisely positioned as the result of the use of the metal contact as a mask during the final oxidizing step.

Another approach which has more general application combines the step of forming the insulating guard ring with a passivating step and shares the feature of the procedure described above of locating the guard ring with respect to the barrier by using the metal contact as a mask during oxidation. An added virtue of this processing sequence is the absence of an oxide mask. The elimination of this step, which has come to be accepted as a standard requirement in planar technology, is an obvious advance. These and other aspects of the invention will be more fully explained in the following detailed description.

Figure 2:
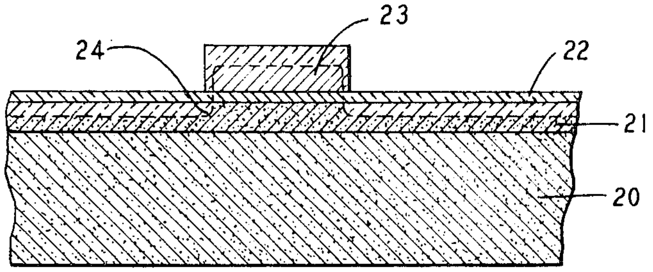

In the drawing:

Fig. 1 is a front sectional view of a silicon substrate processed according to the teachings of the invention; and FIG. 2 is a front section of a silicon barrier device processed according to an alternative embodiment of the invention.

In FIG. 1 the substrate 10 is n+ silicon having an *n*-type layer 11 over its surface. The surface is oxidized by standard methods such as steam or plasma oxidation or by pyrolytic deposition of $SiO_2$ to form an oxide layer 12 over the surface of *n*-layer 11. An appropriate thickness for this layer is defined by the range 1,000 A to 10,000 A although this thickness is not critical. The oxide layer is then etched to expose a window having an average dimension "*a*" of the order of 1 mil although again the dimension is given as exemplary only. A metal silicide-forming metal is deposited in the window. The most effective silicide forming metals are Ni, Ti, Zr, Hf, and the six platinum group metals. The deposition can be achieved by several standard techniques such as evaporation or sputtering. The metal can be evaporated or sputtered over the entire surface and the assembly heated to a temperature in excess of 400 ° C., usually of the order of 700° C., to promote formation of the silicide layer 13 in the window. The metal remaining on the oxide can then be etched away or removed by back-sputtering. The thickness of the deposited film is appropriately 1,000 A and can be varied successfully over the range of 400 A to 2,000 A. After the silicide is formed the surface of the device is covered with a layer 14 of titanium and a layer 15 of platinum to form part of a conventional beam lead-type contact. Appropriate thickness values for these films are 1,000 A and 3,000 A, respectively. These dimensions also are not critical. Sufficient titanium should be used to make the beam contact adhere well to the silicide and to serve a useful"gettering" function. For these purposes 500 A to 2,000 A is sufficient. The platinum layer serves merely to separate the titanium layer from the gold overlay (applied later), and should be somewhat thicker than the titanium layer, i.e., 1,000 A to 5,000 A. The conventional gold overlay 16 is then deposited on a portion of the Ti–Pt contact leaving an annular ring between the overlay and the oxide surrounding the window. This overlay is typically 1 to 20 microns thick. The thickness should be at least twice the combined thickness of the Ti-P–layers to enable the use of the back-sputtering step to be described next but is otherwise relatively unimportant. The contact may be deposited by electroforming in a standard manner. The shape or size of the metal contact is unimportant as long as the annulus between the contact and the oxide layer is preserved. The exposed platinum is then removed by back-sputtering. During this step the gold overlay functions as a mask in the sense that it defines the region of platinum that remains. Back-sputtering of the gold overlay itself is immaterial due to the relative thickness of the layers involved. A back-sputtering technique useful for this and the other back-sputtering operations discussed herein is described and claimed in U.S. Pat. No. 3,271,286 issued Sept. 6, 1966 to M. P. Lepselter. The titanium exposed by this operation is also removed by back-sputtering.

The foregoing sequence of operations is intended as exemplary only. Many variations are possible which contribute the same result. For instance, if the silicide is deposited over the entire surface of the substrate prior to forming the oxide layer 12 then removal of the silicide-forming metal from the oxide surface becomes unnecessary. The objective desired at this stage of the process is to have an annulus between the metal contact and the oxide layer.

The assembly is then subjected to an oxidation step to grow an oxide layer into the zirconium-silicide surface exposed in the annulus. This layer can be grown by the method described and claimed in U.S. Pat. No. 3,337,438 issued Aug. 22, 1967 to G. W. Gobeli and J. R. Ligenza. It is not sufficient to deposit an oxide film in the annulus as the insulating guard ring should extend below the surface, and below the metal silicide-silicon interface to a depth exceeding the space charge thickness. Specifically, it would ordinarily be sufficient for the insulating layer to extend at least 1,000 A below the metal silicide-silicon interface. Where platinum is used as the silicide-forming metal, the platinum silicide is preferably removed by back-sputtering prior to oxidation since platinum-silicide resists oxidation. The resulting structure is a barrier layer device in which, due to the oxide guard ring, the barrier is planar over its entire area. The oxide guard ring forms in exact registration with the metal contact as a result of the use of the metal contact as a mask during the growth of the oxide.

An alternative approach to the formation of an oxide guard ring structure, and one which is preferred from the standpoint of simplicity, is described with reference to FIG. 2. A silicon substrate 20, having an *n*-layer 21 is exposed to a silicide-forming metal to form a metal silicide layer 22 over the entire surface of the semiconductor. The metal contact 23 is then applied to the silicide surface by evaporation and localized etching according to conventional thin film techniques. The contact can consist of any conductive metal such as a gold or titanium, or a film-forming or valve metal such as aluminum, tantalum, niobium, tungsten, zirconium or hafnium. The assembly is then oxidized, such as by the plasma technique referred to in connection with the processing of the device of FIG. 1. The oxide layer will grow into the silicide surface and into the metal contact if it comprises a film-forming metal. The converted region is delineated in FIG. 2 by dashed line 24 indicating the extent of penetration of the oxygen. The silicide region under the contact remains undisturbed (as long as the metal contact is thick enough to prevent oxygen penetration through the contact) but surrounded by an insulating oxide guard ring. The oxidizing step which forms the guard ring serves a dual role including the insulation of the entire surface of the device.

Although the foregoing description largely concerns the metal-silicide barriers, this invention is also applicable to ordinary metal-to-semiconductor barriers such as aluminum on silicon, palladium on germanium, gold on gallium arsenide and other combinations wherein the substrate surface is the barrier interface.

The following examples are given as exemplary of the invention.

EXAMPLE I

This example sets forth a procedure for making a structure similar to that appearing in FIG. 1.

A silicon wafer 10 having an epitaxial layer 11 of approximately 1 ohm cm., *n*-type, is used as the substrate. A 5 micron oxide layer 12 is formed by pyrolysis of tetraethoxysilane in hydrogen at 900° C. or a mixture of $SiCl_4$, $CO_2$ and $H_2$ at 1,000° C., both of which are well-known methods for forming $SiO_2$ films. The oxide is etched by standard photolithographic techniques to form a window with dimension "*a*," of FIG. 1, equal to 25 microns. Next a zirconium film 0.1 microns thick is sputtered over the surface of the assembly by a conventional technique. The film and substrate are heated to a temperature of 700° C. to form zirconium silicide in the window of the oxide layer. The zirconium covering the oxide layer can be removed if desired with dilute HF which dissolves zirconium but does not appreciably attach zirconium silicide. Alternatively, the silicide layer 13 can be applied to the entire surface of the substrate prior to the formation of the oxide layer 12 in which case the step of removing the zirconium from the surface of the oxide layer is avoided. To form the metal contact, 0.15 microns of titanium is sputtered onto the surface followed by 0.35 microns of platinum. Again the sputtering process is conventional. Here it is convenient to use a two cathode system such as that described in Rev. Sci. Inst., 32, 642–645 (1961). Next 12 microns of gold is overlayed over the Pt–Ti contact by electroforming in a conventional manner using, e.g., the plating technique described in U.S. Pat. No. 2,905,601.

The electroformed region has dimensions which provide for the annular space between the beam-type contact, 14, 15, 16 in FIG. 1, and the boundary of the window in the oxide 12. The assembly is back-sputtered during which process the platinum and titanium in the annulus is removed. A corresponding thickness of gold is lost during this step but this thickness is small compared to the thickness of the overlay. The oxide guard ring is then formed by growing an oxide layer into the exposed zirconium-silicide using the metal contact as a mask. The oxidation is carried out by exposing the silicide layer to a high energy oxygen plasma. The plasma is generated by a microwave source operating with 300 to 1,000 watts power at 2,450 mc. in oxygen at one torr pressure with a DC bias of 70 volts between the electrodes. Further details of this process appear in U.S. Pat. No 3,337,438. The oxygen layer is grown to a depth of approximately 2,000 A which requires about a 20 minute exposure to the oxygen plasma.

The resulting structure contains a buried planar barrier enclosed by an insulating guard ring.

EXAMPLE II

This example is directed to a process for the formation of the oxide guard ring structure of FIG. 2 and is characterized by simplicity and economy.

A low resistivity *n*-type silicon substrate 20 having a higher resistivity ($\approx$1 ohm cm.) epitaxial layer 21 is used as the substrate as in example I. A zirconium-silicide layer 22 is formed by essentially the same technique described above in connection with the formation of the layer 13 of FIG. 1. A metal contact 23 is made to the silicide layer by evaporation of 10 microns of aluminum using a heavy tungsten filament at 1,200° C. (A1 vapor pressure $-10^{12}$ torr). The contact is defined, after masking by standard photolithography, by etching with dilute NaOH. The resulting structure is oxidized as in example I to form the oxide guard ring around the buried barrier layer. The oxidation process also forms an insulating layer over the aluminum contact. In this example the oxidation step simultaneously performs two important functions — formation of the insulating guard ring and insulation of the surface of the device, including the metal contact. Electrical contact to 23, by, e.g., wire, beam lead or printed circuit, can be made conveniently prior to oxidation.

Barrier layer diodes made by this technique were found to evidence good reverse breakdown characteristics. A sharp breakdown occurred at about 40 volts, which is very near the theoretically ideal value.

EXAMPLE III

In this example the procedure of example 11 is followed except that the metal silicide layer is omitted. THe aluminum contact forms a surface barrier with the silicon substrate and the oxidation is carried on directly. Although the electrical characteristics of the Al–Si barrier are different from those of the Si-silicide barrier of example II, the oxide guard ring, which is the essence of the invention, is equally effective.

While the specific or detailed portions of the above description are largely in terms of metal silicide-silicon barriers and oxide guard rings, the contribution of this invention is believed to be more general. Essentially, the invention is intended to cover an insulating guard ring in combination with a barrier layer. For instance an obvious variation would be to use a silicon nitride guard ring. This could be produced by a procedure almost identical to that described in connection with the formation of the oxide guard ring. The substitution of a nitrogen plasma for the oxygen plasma in the oxidation step is straightforward.

For the purposes of the invention it is essential only that the guard ring be insulating. While other possibilities no doubt exist, the use of nitrogen, oxygen and carbon, and mixtures of these such as $NO^+$ and $Co^+$, would appear to be most likely to be useful on the basis of existing evidence. Further, the guard ring can be used in conjunction with other metal-semiconductor barriers, e.g., palladium-germanium and gold-gallium arsenide. The term"ring" as used herein is a convenient term for defining a perimeter. Obviously the perimeter could assume other configurations such as a star or polygonal shape.

The formation of an insulating guard ring around a PN junction is described fully in copending application Ser. No. 778,087, filed Nov. 22, 1968 by M. P. Lepselter and A. U. Mac Rae and to the extent that that disclosure supplements the foregoing description, is incorporated herewith.

We claim:

1. A method for making a barrier layer device comprising the steps of forming a metal silicide layer over the surface of a planar silicon substrate thus producing a metal silicide/silicon rectifying barrier at a depth of less than 2,000 A, depositing a metal contact on the metal silicide layer, and contacting at least the exposed portions of the metal silicide layer around the metal contact with a gas plasma comprising ions selected from the group consisting of oxygen, nitrogen, carbon and mixtures thereof under conditions such that the metal silicide is converted to an insulating region around the metal contact while leaving the metal silicide/silicon silicon barrier beneath the metal contact largely intact and continuing the exposure to the gas plasma until the depth of the insulating region below the surface exceeds the depth of the metal silicide layer.

2. The method according to claim 1, in which the metal contact comprises Zr, Hf, Al, W, Ta or Nb and is itself exposed to the gas plasma so as to form an insulating coating in the surface of the contact.

3. The method according to claim 1, wherein the metal component of the metal silicide is selected from the group consisting of Ni, Ti, Zr, Hf and the six platinum group metals.

* * * * *